United States Patent
Kurashige et al.

(10) Patent No.: US 7,264,750 B2
(45) Date of Patent: Sep. 4, 2007

(54) RARE EARTH SILICATE SINGLE CRYSTAL AND PROCESS FOR PRODUCTION OF RARE EARTH SILICATE SINGLE CRYSTALS

(75) Inventors: Kazuhisa Kurashige, Hitachinaka (JP); Naoaki Shimura, Hitachinaka (JP); Hiroyuki Ishibashi, Hitachinaka (JP); Akihiro Gunji, Hitachinaka (JP); Mitsushi Kamada, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 472 days.

(21) Appl. No.: 10/898,209

(22) Filed: Jul. 26, 2004

(65) Prior Publication Data
US 2005/0056204 A1 Mar. 17, 2005

(30) Foreign Application Priority Data
Jul. 24, 2003 (JP) ............................ P2003-279335
Jun. 17, 2004 (JP) ............................ P2004-180161

(51) Int. Cl.
*C30B 29/34* (2006.01)
(52) U.S. Cl. ............................ 252/301.4 F; 423/326; 501/86; 117/13; 117/14; 117/642; 250/361 R
(58) Field of Classification Search ............... 423/326; 501/86; 117/13, 14, 942; 252/301.4 F; 250/361 R
See application file for complete search history.

(56) References Cited

U.S. PATENT DOCUMENTS 5,667,583 A * 9/1997 Kurata et al. ............ 117/13
6,302,956 B1 * 10/2001 Alenkov et al. .......... 117/13

FOREIGN PATENT DOCUMENTS

| JP | 03-103398 | | 4/1991 |
| JP | 07-187880 | | 7/1995 |
| JP | 09110600 A | * | 4/1997 |
| JP | 2004043302 A | * | 2/2004 |

* cited by examiner

*Primary Examiner*—David Sample
(74) *Attorney, Agent, or Firm*—Griffin & Szipl, P.C.

(57) ABSTRACT

When produced as a single crystal ingot, a rare earth silicate single crystal 1 can be formed by cutting out from the single crystal ingot. The single crystal 1 has a crystal face F100 whose Miller indices can be determined by X-ray diffraction. The crystal face F100 is composed of a plurality of smooth partial region surfaces (for example, the partial region surface f100A and partial region surface f100B), the plurality of partial region surfaces each have an area detectable by X-ray diffraction, and the angles θ formed between the normal vectors of the plurality of partial region surfaces satisfy the following inequality:

$$0.1° \leq \theta \leq 2.0°. \tag{1}$$

27 Claims, 5 Drawing Sheets

RARE EARTH SILICATE SINGLE CRYSTAL AND PROCESS FOR PRODUCTION OF RARE EARTH SILICATE SINGLE CRYSTALS

This application claims priority from Japanese Patent Application No. P2004-180161, filed Jun. 17, 2004 and Japanese Patent Application No. P2003-279335, filed Jul. 24, 2003, the entire disclosures of which is incorporated herein by reference.

BACKGROUND OF THE INVENTION

1. Field of the Invention

The present invention relates to rare earth silicate single crystals used for scintillators and the like, as well as to a process for production of the rare earth silicate single crystals.

2. Related Background Art

A "melt process", whereby single crystals are produced from molten liquid obtained by heating starting material, is known as a process for production of single crystals used in electronic devices and the like, such as Ce-added $Gd_2SiO_5$ single crystals (hereinafter referred to as "$Gd_2SiO_5$:Ce single crystals" or "GSO single crystals", as necessary) used as scintillator materials (for example, Japanese Patent Laid-Open No. 3-103398 and Japanese Patent Laid-Open No. 7-187880). This production process is designed to obtain single crystals with low residual distortion and high crystallinity.

SUMMARY OF THE INVENTION

However, when GSO single crystals are produced by the conventional melt process, fracture (cleavage fracture) has occured during the single crystal growth step, the cutting step for cutting the obtained single crystals (or single crystal ingots), or the polishing step for polishing the single crystals (or single crystal ingots). This problem has been particularly notable when attempting to produce large single crystals (or single crystal ingots) having a 2000 $cm^3$ or greater volume or a 90 mm or greater diameter.

For example, in the case of GSO single crystals, since cleavage can be formed along the (100) plane and the thermal expansion coefficient in the [010] axis direction is 2-3 times the thermal expansion coefficient in another axis direction, this has been a cause of crystal fracture.

This problem has also occurred with single crystals made of inorganic materials other than GSO single crystals.

The present invention has been accomplished in light of the problem described above, and its object is to provide rare earth silicate single crystals which can satisfactorily prevent cleavage fracture even at large sizes, as well as to provide a process for their production.

As a result of much diligent research, the present inventors have discovered that the following stresses 1) to 3) have a major influence on the problem of fracture. Specifically, these stresses are: 1) thermal stress generated during the processes of cutting out the obtained crystals and cooling the crystals, 2) stress generated due to thermal expansion coefficient anisotropy resulting from polycrystalline growth, and 3) residual stress due to internal crystal defects produced during crystal growth.

As a result of further research in consideration of generation of these stresses 1) to 3), the present inventors have also found that when producing rare earth silicate single crystals for an optical material such as a scintillator material, the object stated above can be achieved if the crystallinity is purposely reduced within a range permissible for optical materials, contrary to the common understanding among those skilled in the art that the production conditions should generally be set so as to obtain single crystals with minimized distortion and high crystallinity, and the present invention was completed on the basis of this finding.

In other words, the present invention provides a rare earth silicate single crystal which, when produced as a single crystal ingot, can be formed by being cut out from the single crystal ingot, and which has a crystal face whose Miller indices can be determined by X-ray diffraction, wherein the crystal face is composed of a plurality of smooth partial region surfaces, the plurality of partial region surfaces each have an area detectable by X-ray diffraction, and the angles θ formed between the normal vectors of the plurality of partial region surfaces satisfy the following inequality (1).

$$0.1° \leq \theta \leq 2.0° \quad (1)$$

Within the range satisfying the condition represented by inequality (1), crystallinity adequately suitable for optical materials such as scintillator materials can be maintained, while generation of cleavage fracture can also be adequately prevented even under the aforementioned stresses 1) to 3) during the production steps.

More specifically, single crystals which can be adequately used as an optical material such as a scintillator material can be obtained so long as each of the angles θ formed between the normal vectors of the plurality of smooth partial region surfaces are no greater than 5°.

Furthermore, within the range satisfying the condition represented by inequality (1), it is possible to obtain a single crystal wherein the cleavage plane orientations of the single crystal are not uniform. Production of such a single crystal wherein the orientations of the cleavage planes {for example, the (100) planes, in the case of a GSO single crystal} are not uniform, i.e. a single crystal satisfying the condition of inequality (1), can adequately prevent generation of fracture (cleavage fracture) during the production steps.

Although the detailed mechanism which allows generation of cleavage fracture to be adequately prevented even under the aforementioned stresses 1) to 3) during the production steps when the angles θ formed between the normal vectors of the plurality of partial region surfaces of the crystal faces satisfy the condition represented by inequality (1) has not been elucidated, the present inventors believe it to be as follows.

As explained above, in the case of a single crystal, during the production steps which include the cutting step, the polishing step, and the etching step wherein the crystal surface is etched with a high temperature etching solution, if minute cracks occur in the crystal surface obtained by the above processing or treatment due to distortion created by the processing or treatment, these minute cracks easily give rise to generation and propagation (development) of cracks throughout the entire single crystal after the processing or treatment. The reason is that it is more difficult to halt propagation (development) of cracks in the case of a single crystal, since the constituent atoms are regularly arranged. In addition, the propagation (development) of cracks occurs most notably on the cleavage plane.

However, the rare earth silicate single crystal of the invention has its constituent atoms disarranged so as to satisfy the condition represented by inequality (1). Even when minute cracks are generated in the crystal surface obtained by the production steps as a result of distortion as described above, the disarrangement of the constituent atoms adequately inhibits the minute cracks from giving rise to generation and propagation (development) of cracks through the entire single crystal after the processing or treatment.

In other words, satisfying the condition of $0.1° \leq \theta$ leads to disarrangement of the constituent atoms in the crystal to such a degree as to adequately inhibit generation and propagation (development) of cracks. According to the present invention, especially when the angles θ formed between the normal vectors of the plurality of partial region surfaces of the cleavage plane which is susceptible to generation and propagation (development) of cracks satisfy the condition represented by inequality (1), the aforementioned generation and propagation (development) of cracks can be adequately inhibited.

If θ is less than 0.1°, the disarrangement of the constituent atoms in the crystal to such a degree as to adequately inhibit the aforementioned generation and propagation (development) of cracks cannot be produced, and therefore the effect of the invention explained above cannot be achieved.

If θ in inequality (1) is greater than 2.0°, a large degree of distortion will remain in the single crystal obtained upon cooling to room temperature (25° C.) after heat treatment during the production steps, and it will be difficult to adequately prevent generation of fractures which release the distortion during the processing such as the cutting, the polishing and the etching, so that the effect of the invention explained above will not be achievable. Particularly in the case of GSO single crystals, in the temperature range of 600° C., for example, the thermal expansion coefficient in the [100] axis direction is about $5 \times 10^{-6}/°$ C., the thermal expansion coefficient in the [010] axis direction is about $16 \times 10^{-6}/°$ C. and the thermal expansion coefficient in the [001] axis direction is about $7 \times 10^{-6}/°$ C.; thus, since the difference in the thermal expansion coefficients is approximately 2 to 3 times depending on the crystal orientation, it is difficult to adequately prevent generation of fractures which release the aforementioned distortion, and the effect of the invention explained above cannot be achieved.

Specifically, a rare earth silicate single crystal according to the invention has a structure wherein the crystal face is composed of a plurality of smooth partial region surfaces (the crystallinity is purposely reduced as compared to conventional single crystals), while the plurality of partial region surfaces are controlled so as to satisfy the condition represented by inequality (1) above, and therefore generation of cleavage fracture can be adequately prevented even with large sized crystals.

For example, a rare earth silicate single crystal according to the invention may be produced as a large single crystal (or single crystal ingot) with a 2000 cm³ or greater volume or a 90 mm or greater diameter, by controlling the plurality of partial region surfaces to satisfy the condition represented by inequality (1).

According to the invention, the "rare earth element" constituent of the "rare earth silicate" is a Group 3B element, or more specifically, Sc, Y, La, Ce, Pr, Nd, Gd, Tb, Ho, Er, Tm, Lu, Sm, Eu, Dy, Pm or Yb.

The invention further provides a process for production of a rare earth silicate single crystal, wherein said process comprises at least a melting step wherein the starting material is melted down to obtain a molten liquid by a melt process, a cooling/solidification step wherein the molten liquid is cooled to solidification to obtain a single crystal ingot, and a cutting step wherein the single crystal ingot obtained by the cooling/solidification step is cut to a prescribed shape and size, wherein the chemical composition conditions of the molten liquid, the melting conditions in the melting step, and the cooling conditions in the cooling/solidification step are at least controlled in such a manner that the cut surfaces of the single crystal ingot which has been cut in the cutting step are crystal faces whose Miller indices can be determined by X-ray diffraction, the crystal faces are each composed of a plurality of smooth partial region surfaces, and the angles θ formed between the normal vectors of the plurality of partial region surfaces satisfy the following inequality (1).

$$0.1° \leq \theta \leq 2.0° \quad (1)$$

Although the mechanism in detail have not been clearly elucidated, the present inventors believe that one of the major causes of fracture (cleavage fracture) during the production steps for a single crystal, which include the cutting step and the polishing step, is that the cleavage plane orientations of the single crystal are uniform. By producing a single crystal wherein the orientations of the cleavage planes of the single crystal {for example, the (100) planes in the case of a GSO single crystal as described above} are not uniform, i.e. a single crystal which satisfies the condition of inequality (1), it is possible to adequately prevent generation of fracture (cleavage fracture) during the production steps.

In other words, by at least controlling the chemical composition conditions of the molten liquid, the melting conditions in the melting step, and the cooling conditions in the cooling/solidification step so that the condition of inequality (1) is satisfied, it is possible to more reliably form rare earth silicate single crystals which allow generation of cleavage fracture to be adequately prevented even under the aforementioned stresses 1) to 3) in the production steps.

Consequently, the production process for rare earth silicate single crystals according to the invention allows easy and reliable formation of rare earth silicate single crystals according to the invention as described above.

The invention still further provides a process for production of a rare earth silicate single crystal, wherein said process comprises at least a melting step wherein the starting material is melted down to obtain a molten liquid by a melt process, a cooling/solidification step wherein the molten liquid is cooled to solidification to obtain a single crystal ingot, a cutting step wherein the single crystal ingot obtained by the cooling/solidification step is cut to a prescribed shape and size, and a selection step wherein single crystals cut from the single crystal ingot obtained by the cutting step, in which the cut surfaces are crystal faces whose Miller indices can be determined by X-ray diffraction, the crystal faces are each composed of a plurality of smooth partial region surfaces, and the angles θ formed between the normal vectors of the plurality of partial region surfaces satisfy the following inequality (1), are selected, while those not satisfying the conditions are excluded.

$$0.1° \leq \theta \leq 2.0° \quad (1)$$

This production process for rare earth silicate single crystals also allows easy and reliable formation of rare earth silicate single crystals according to the invention as described above.

DESCRIPTION OF THE PREFERRED EMBODIMENTS

The rare earth silicate single crystals and rare earth silicate single crystal production process of the invention will now be explained in greater detail. A preferred embodiment of the rare earth silicate single crystals of the invention will be explained first.

Figure 1:
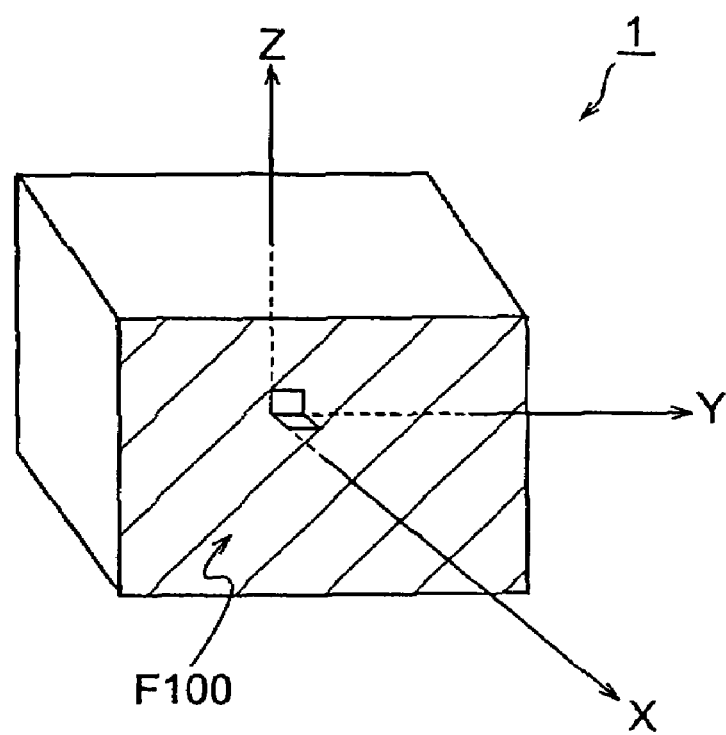
FIG. 1 is a simplified perspective view of a preferred embodiment of a rare earth silicate single crystal of the invention.

FIG. 1 is a simplified perspective view of a preferred embodiment of a rare earth silicate single crystal of the invention (particularly a GSO single crystal).

FIG. 2(a) is a schematic cross-sectional view of a portion of the crystal face (cleavage plane) of the rare earth silicate single crystal shown in FIG. 1, as seen from the direction of the Z-axis shown in FIG. 1 (for example, the [001] axis in the case of a GSO single crystal). FIG. 2(b) is an illustration showing the angle θ formed between the normal vector f100a of the partial region surface f100A and the normal vector f100b of the partial region surface f100B, shown in FIG. 2(a).

For example, when the rare earth silicate single crystal 1 shown in FIG. 1 (hereinafter referred to as "single crystal 1") is a GSO single crystal, the crystal face (cleavage plane) is the (100) plane. In this case, the X-axis shown in FIG. 1 is the [100] axis of the GSO single crystal, the Y-axis is the [010] axis of the GSO single crystal, and the Z-axis is the [001] axis of the GSO single crystal.

The single crystal 1 shown in FIG. 1 is preferably formed by the production process of the invention as described later. When produced as a single crystal ingot, the single crystal 1 shown in FIG. 1 can be formed by cutting out from the single crystal ingot. And the single crystal 1 has a crystal face F100 whose Miller indices can be determined by X-ray diffraction. Also, the crystal face F100 consists of a plurality of smooth partial region surfaces. For example, it may be the partial region surface f100A and partial region surface f100B shown in FIG. 2. According to the invention, the "crystal face" (for example, crystal face F100) refers to a crystal face which is detectable by XRD analysis.

According to the invention, "plurality of smooth partial region surfaces" means surfaces which each have an area large enough to be detected by XRD analysis (0.1-2.0 cm$^2$) and which are evaluated as essentially "smooth" by XRD analysis.

Figure 2:
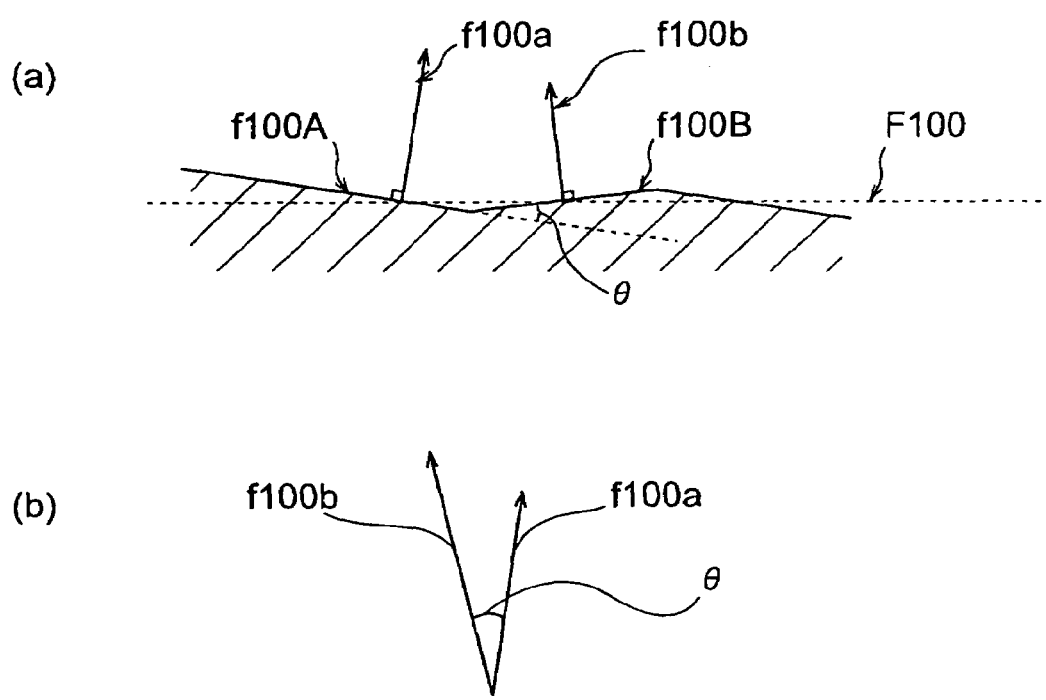
FIG. 2(a) is a schematic cross-sectional view of a portion of the crystal face (cleavage plane) of the rare earth silicate single crystal shown in FIG. 1, as seen from the direction of the Z-axis shown in FIG. 1.
FIG. 2(b) is an illustration showing the angle θ formed between the normal vector f100a of the partial region surface f100A and the normal vector f100b of the partial region surface f100B, shown in FIG. 2(a).

Also, the plurality of partial region surfaces composing the crystal face F100 (the partial region surface f100A, partial region surface f100B, etc. shown in FIG. 2) each have an area which is detectable by X-ray diffraction. The angles θ formed between the different normal vectors of the plurality of partial region surfaces composing the crystal face F100, as illustrated by the partial region surface f100A and partial region surface f100B in FIG. 2, satisfy the condition represented by inequality (1) below. The values for θ are also measured by XRD analysis.

$$0.1° \leq \theta \leq 2.0° \qquad (1)$$

The single crystal 1 has a structure wherein the crystal face F100 is formed from the plurality of smooth partial region surfaces (the crystallinity is purposely reduced compared to conventional single crystals), while the plurality of partial region surfaces (the partial region surface f100A, partial region surface f100B, etc. shown in FIG. 2) are controlled so as to satisfy the condition represented by inequality (1) above, and therefore generation of cleavage fracture can be adequately prevented even with large sized crystals.

If θ is less than 0.1°, the disarrangement of the constituent atoms in the crystal to such a degree as to adequately inhibit the aforementioned generation and propagation (development) of cracks cannot be produced, and therefore the effect of the invention explained above cannot be achieved.

If θ in inequality (1) is greater than 2.0°, a large degree of distortion will remain in the single crystal obtained upon cooling to room temperature (25° C.) after heat treatment during the production steps, and it will be difficult to adequately prevent generation of fractures which release the distortion during the processing such as the cutting, the polishing and the etching, so that the effect of the invention explained above will not be achievable. Particularly in the case of GSO single crystals, in the temperature range of 600° C., for example, the thermal expansion coefficient in the [100] axis direction is about 5×10$^{-6}$/° C., the thermal expansion coefficient in the [010] axis direction is about 16×10$^{-6}$/° C. and the thermal expansion coefficient in the [001] axis direction is about 7×10$^{-6}$/° C.; thus, since the difference in the thermal expansion coefficients is approximately 2 to 3 times depending on the crystal orientation, it is difficult to adequately prevent generation of fractures which release the aforementioned distortion, and the effect of the invention explained above cannot be achieved.

The single crystal 1 is preferably a monoclinic crystal belonging to space group P2$_1$/c. Such a single crystal 1 will more readily exhibit the effect of the invention. GSO single crystals may be mentioned as this type of single crystal 1.

In the single crystal 1, the crystal face F100 is the (100) plane, and cleavage preferably can be formed along the (100) plane. This type of single crystal 1 will more readily exhibit the effect of the invention. GSO single crystals may be mentioned as this type of single crystal 1.

The single crystal 1 preferably has the chemical composition represented by general formula (2) below and simultaneously satisfies the conditions represented by inequalities (3) to (5) below. Such a single crystal 1 will more readily exhibit the effect of the invention.

$$Ln_{2x}Si_yO_{(3x+2y)}:A \qquad (2)$$

$$0.9 \leq x \leq 1.1 \qquad (3)$$

$$0.9 \leq y \leq 2.1 \quad (4)$$

$$4.5 \leq (3x+2y) \leq 7.5 \quad (5)$$

[Here, $Ln_{2x}Si_yO_{(3x+2y)}$ represents the chemical composition of the host material, Ln represents at least one element selected from the group consisting of rare earth elements, A is an element constituting dopant doped in the host material and represents at least one element selected from the group consisting of Ce, Eu, Tb and Yb, and x and y each represent a value simultaneously satisfying the conditions represented by inequalities (3) to (5).]

When the conditions of inequalities (2) to (5) are satisfied, the single crystal 1 preferably has the chemical composition represented by the following formula (I). Such a single crystal 1 (GSO single crystal) will more readily exhibit the effect of the invention.

$$Gd_2SiO_5:Ce \quad (I)$$

The single crystal 1 may also have the chemical composition represented by general formula (6) below and simultaneously satisfy the conditions represented by inequalities (7) to (9) below. This will readily exhibit the effect of the invention even if the single crystal contains no dopant.

$$Ln_{2x}Si_yO_{(3x+2y)} \quad (6)$$

$$0.9 \leq x \leq 1.1 \quad (7)$$

$$0.9 \leq y \leq 2.1 \quad (8)$$

$$4.5 \leq (3x+2y) \leq 7.5 \quad (9)$$

[Here, $Ln_{2x}Si_yO_{(3x+2y)}$ represents the chemical composition of the host material, Ln represents at least one element selected from the group consisting of rare earth elements, and x and y each represent a value simultaneously satisfying the conditions represented by inequalities (7) to (9).]

When the conditions of general formula (6) and inequalities (7) to (9) are satisfied, the single crystal 1 preferably has the chemical composition represented by the following formula (II). Such a single crystal 1 will more readily exhibit the effect of the invention.

$$Gd_2SiO_5 \quad (II)$$

A preferred embodiment of the production process for a rare earth silicate single crystal of the invention will now be explained.

The production process for a rare earth silicate single crystal of the invention comprises at least a melting step wherein the starting material is melted down to obtain a molten liquid by a melt process, a cooling/solidification step wherein the molten liquid is cooled to solidification to obtain a single crystal ingot, and a cutting step wherein the single crystal ingot obtained by the cooling/solidification step is cut to a prescribed shape and size.

In the production process for a rare earth silicate single crystal of the invention, the chemical composition conditions of the molten liquid, the melting conditions in the melting step, and the cooling conditions in the cooling/solidification step are at least controlled in such a manner that the cut surface of the single crystal 1 which has been cut in the cutting step is a crystal face F100 whose Miller indices can be determined by X-ray diffraction, the crystal face F100 is composed of a plurality of smooth partial region surfaces (for example, the partial region surface f100A and partial region surface f100B shown in FIG. 2), and the angles θ formed between the normal vectors of the plurality of partial region surfaces satisfy inequality (1) below. This process will allow the aforementioned single crystal 1 to be obtained in a more easy and reliable manner.

$$0.1° \leq \theta \leq 2.0° \quad (1)$$

From the standpoint of more reliably achieving the effect of the invention, the melt process is preferably the Czochralski process. In this case, the lifting apparatus 10 having the construction shown in FIG. 3 is preferably used for the melting step and cooling/solidification step.

Figure 3:
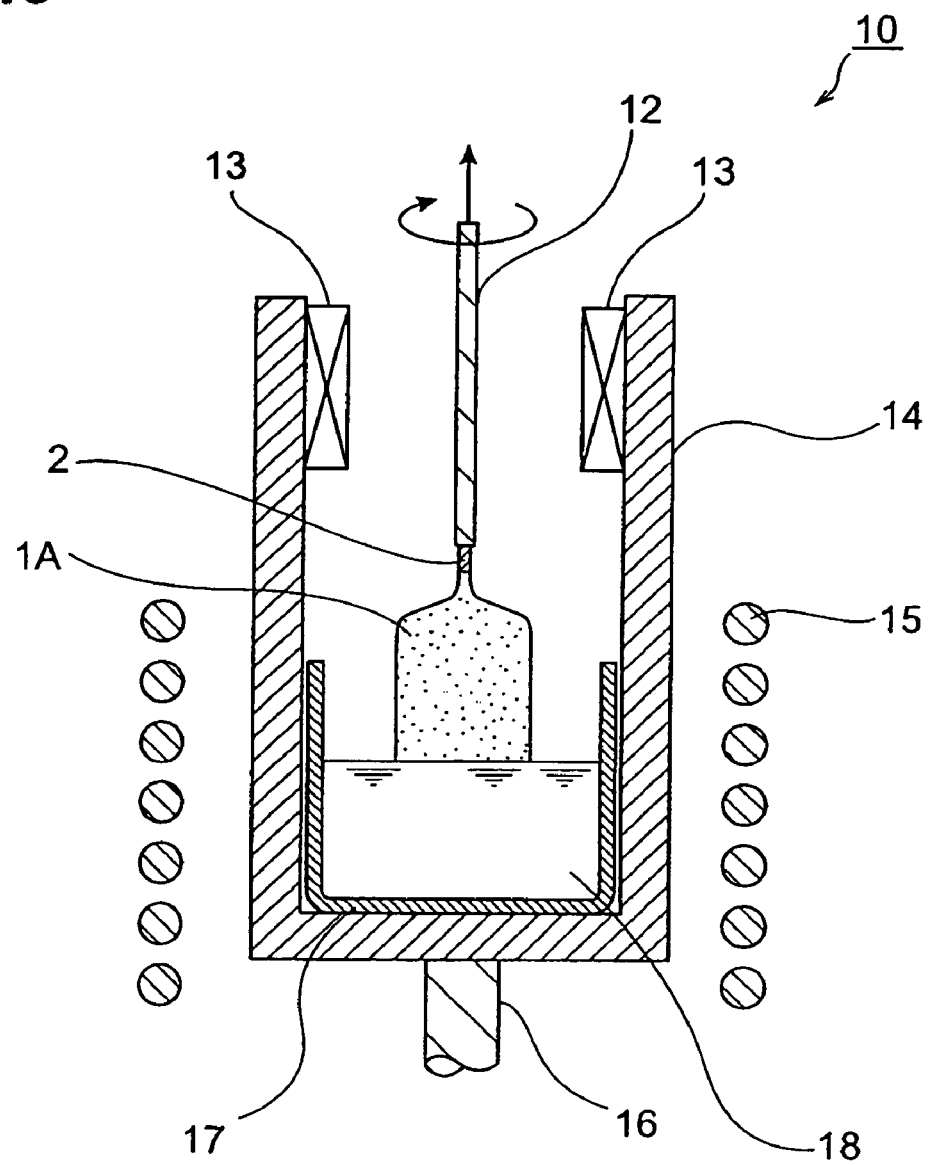
FIG. 3 is a schematic cross-sectional view of an example of the basic construction of a lifting apparatus used for a preferred embodiment of the production process of the invention.

FIG. 3 is a schematic cross-sectional view of an example of the basic construction of a lifting apparatus used for a preferred embodiment of the production process of the invention.

The lifting apparatus 10 shown in FIG. 3 has a high-frequency induction heating furnace (2-zone heating growth furnace) 14. The high-frequency induction heating furnace 14 is for continuous operation during the melting step and cooling/solidification step described above.

The high-frequency induction heating furnace 14 is a refractory receptacle with a cylindrical side wall and the shape of the receptacle is the same as used for single crystal production based on the publicly known Czochralski process. A high-frequency induction coil is wound on the side wall at the bottom of the high-frequency induction heating furnace 14. Also, a crucible 17 (for example, an Ir crucible) is situated on the bottom surface inside the high-frequency induction heating furnace 14. The crucible 17 also serves as a high-frequency induction heater. The constituent material of the single crystal 1 is loaded into the crucible 17, and application of high-frequency induction to the high-frequency induction coil 15 causes the crucible 17 to be heated, thereby yielding a molten liquid 18 (melt) of the constituent material of the single crystal 1.

A heater 13 (resistance heater) is also situated on the upper inner wall of the high-frequency induction heating furnace 14, which is out of contact with the molten liquid. The heat output from the heater can be controlled independently of the high-frequency induction coil 15.

Also, an opening (not shown) is formed passing from the interior through to the exterior of the high-frequency induction heating furnace 14 at the center of the bottom of the high-frequency induction heating furnace 14. A crucible support 16 is inserted through this opening from the exterior of the high-frequency induction heating furnace 14, and the tip of the crucible support 16 is connected to the bottom of the crucible 17. By rotating the crucible support 16 it is possible to rotate the crucible 17 in the high-frequency induction heating furnace 14. A gap between the opening and the crucible support 16 is sealed with packing or the like.

A more specific production process using the lifting apparatus 10 will now be explained.

First, in the melting step, the constituent material of the single crystal 1 is loaded into the crucible 17 and high-frequency induction is applied to the high-frequency induction coil 15 to yield a molten liquid 18 (melt) of the constituent material of the single crystal 1.

Next, the molten liquid is cooled to solidification in the cooling/solidification step to obtain a cylindrical single crystal ingot 1A. More specifically, the procedure is carried out in two steps, a growth step and a cooling step, described below.

First, in the growth step, a lifting rod 12 having a seed crystal 2 fixed to its lower end is introduced into the molten liquid 18 from the top of the high-frequency induction heating furnace 14, and then the lifting rod 12 is lifted out to form a cylindrical single crystal ingot 1A. During the growth step, the heat output from the heater 13 is controlled to grow the cylindrical single crystal ingot 1A lifted out from the molten liquid 18 until its cross-section has a diameter of D [mm].

Next, in the cooling step, the heat output from the heater is controlled to cool the grown single crystal ingot (not shown) obtained by the growth step.

From the standpoint of more reliably producing a single crystal 1 satisfying the condition represented by inequality (1), the heat output from the heater 13 is preferably controlled in the cooling step so that the cooling conditions for the cooling/solidification step simultaneously satisfy the conditions represented by the following inequalities (10) and (11):

$$0.25D \leq A \leq 0.35D \tag{10}$$

$$B \geq 0.4D \tag{11}$$

wherein A represents the cooling time [h] required to reduce the heat output from 100% to 50% and B represents the cooling time [h] required to reduce the heat output from 50% to 0% in the cooling step, where 100% is the heat output from the heater at the end of the growth step.

The present inventors have found that by controlling the heat output (kW) from the heater 13 so as to simultaneously satisfy the conditions of inequalities (10) and (11), it is possible to reliably prevent generation of cracks. Heat distortion can be generated in the single crystal even by rapid cooling in the cooling step after the single crystal has been grown in the growth step, but this will tend to increase generation of cracks in the single crystal 1 (for example, GDO single crystal). Cracks tend to be generated more easily with a shorter cooling time.

From the standpoint of adequately preventing generation of cracks in the single crystal 1 (for example, GDO single crystal) during the procedure of the melting step and the cooling/solidification step, the gas phase of the high-frequency induction heating furnace 14 is preferably filled with a mixed gas composed mainly of an inert gas satisfying the condition represented by the following inequality (12):

$$0\% < 100 \times \{G/(E+G)\} \leq 2.0\% \tag{12}$$

wherein E represents the partial pressure of the inert gas in the mixed gas, and G represents the partial pressure of oxygen gas in the mixed gas. According to the invention, "inert gas" means a noble gas or nitrogen gas.

If the value of $\{G/(E+G)\}$ is 0%, microcracks will tend to be generated in the single crystal 1 more easily by heat etching. On the other hand, if the value of $\{G/(E+G)\}$ is greater than 2.0%, the crystal will tend to become colored, and the scintillator performance will tend to be lower. If the value of $\{G/(E+G)\}$ is greater than 4.0%, and Ir is used as the structural material of the crucible, the structural material will undergo severe vaporization, thereby hampering growth of the crystal.

Next, in the cutting step, the single crystal ingot 1A is cut to a prescribed shape and size to obtain a single crystal 1.

Preferred embodiments of the invention were explained in detail above, but the invention is not limited to the aforementioned embodiments. For example, the production steps after the cutting step in the production process of the invention described above may be as follows. Specifically, a selection step may be carried out wherein single crystals cut from the single crystal ingot obtained by the cutting step, in which "the cut surfaces are crystal faces whose Miller indices can be determined by X-ray diffraction, the crystal faces are composed of a plurality of smooth partial region surfaces, and the angles θ formed between the normal vectors of the plurality of partial region surfaces satisfy the following inequality (1)" are selected, while those not satisfying the conditions are excluded.

$$0.1° \leq \theta \leq 2.0 \tag{1}$$

EXAMPLES

Figure 4:
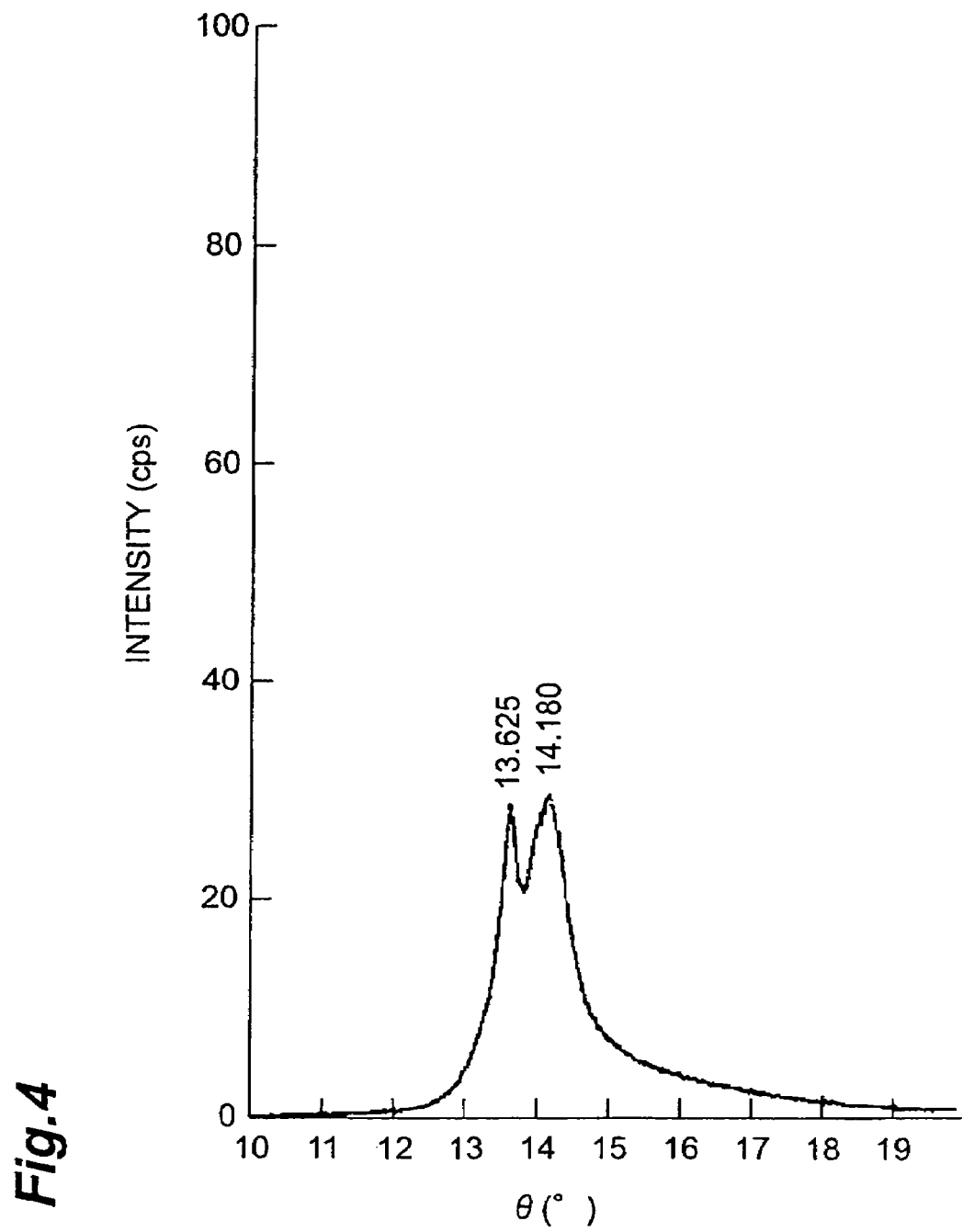
FIG. 4 is a graph showing the X-ray diffraction pattern obtained for the rare earth silicate single crystal obtained in Example 1.
Figure 5:
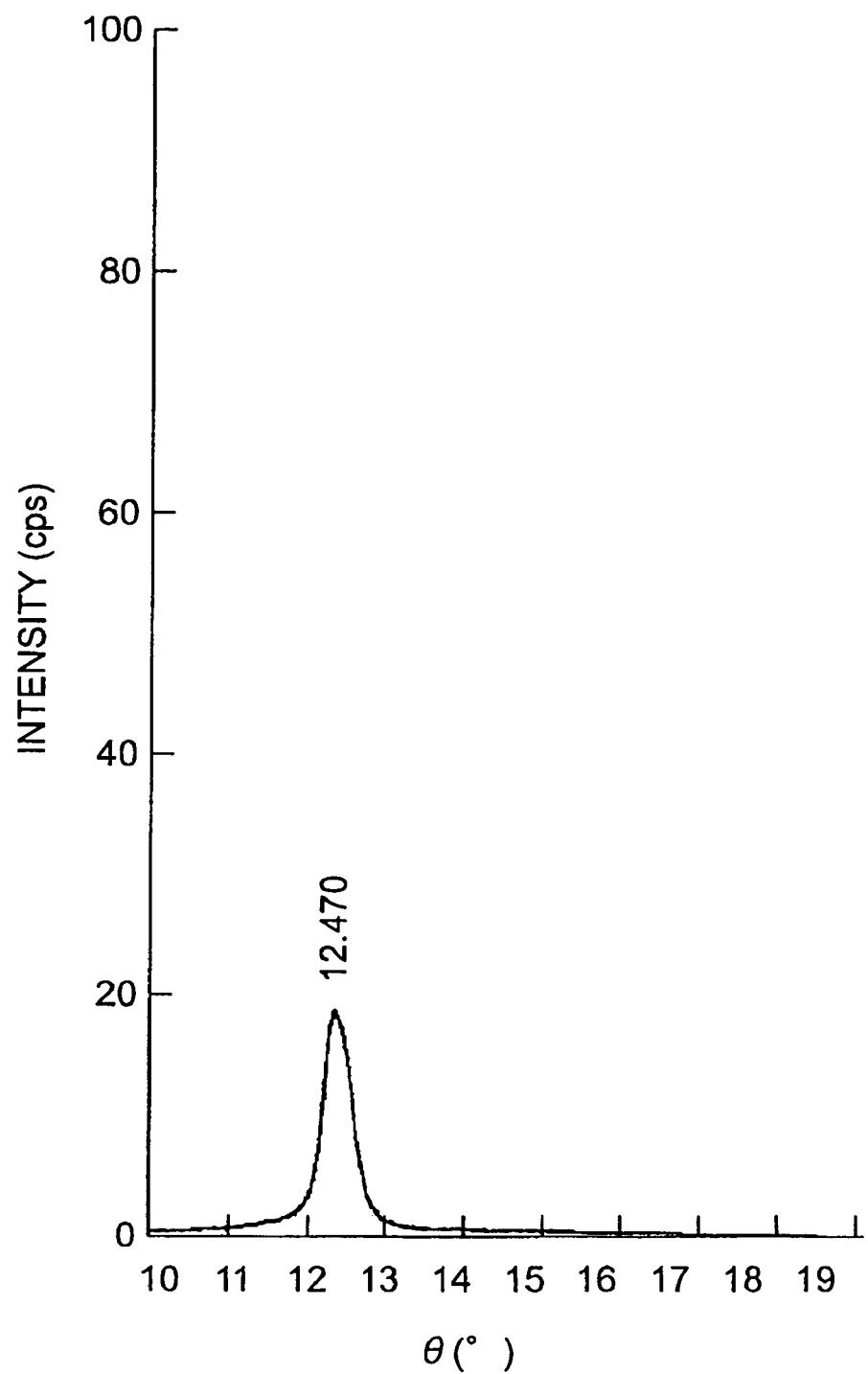
FIG. 5 is a graph showing the X-ray diffraction pattern obtained for the rare earth silicate single crystal obtained in Comparative Example 1.

Preferred examples of the invention will now be explained in greater detail, with the understanding that these examples are in no way limitative on the invention. FIG. 4 is a graph showing the X-ray diffraction pattern obtained for the rare earth silicate single crystal obtained in Example 1 below. FIG. 5 is a graph showing the X-ray diffraction pattern obtained for the rare earth silicate single crystal obtained in Comparative Example 1 below.

Example 1

A mixture of 20489.1 g of $Gd_2O_3$, 97.8 g of $CeO_2$ and 3413.1 g of $SiO_2$ (total of 24,000 g) was loaded into an Ir crucible with a 180 mm diameter, a 180 mm height and a 3 mm thickness. The mixture was then heated in a high-frequency induction heating furnace to above 1950° C. and melted down to obtain a molten liquid comprising $Ce_{0.01}Gd_{1.99}SiO_5$.

Next, the tip of a lifting rod having a seed crystal fixed to its lower end was introduced into the molten liquid for seeding. A single crystal ingot with an 8 mm neck diameter was lifted out at a lifting speed of 1-3 mm/h to form a neck section. A cone section (cylindrical section) was then lifted out, with lifting of the cylindrical section starting when the diameter (D) reached 105 mm. After growing the cylindrical section, the single crystal ingot was cut away from the molten liquid and cooling was initiated.

In order to simultaneously satisfy the conditions of inequalities (10) and (11) above, the cooling time A was 30 hours and the cooling time B was 50 hours. Upon completion of the cooling, the obtained single crystal was removed out. The obtained single crystal ingot had a crystal mass of 19.6 kg, a cone section length of 70 mm, a cylinder length of 290 mm and a cylindrical section diameter (D) of 108 mm.

An inner perimeter knife cutter was used for sectional cutting of the obtained single crystal ingot at spacings of 20 mm. The blade used in the inner perimeter knife cutter was electrodeposited with #325-400 natural diamond. After the sectional cutting, a multi band saw was used for cutting of the resultant single crystals at a 6 mm pitch in the direction normal to the sectional cutting, followed by cutting at a 4 mm pitch in the direction normal to the obtained cut surfaces, thereby cutting out 4×6×20 mm products (single crystals). The cutting abrasive used in the multi band saw was a #500 SiC slurry. When the 4×6×20 mm cut products were examined, 5% of the products exhibited cleavage fracture, and therefore the yield was 95%.

Next, reflection on the (100) planes of the cut products was measured using X-rays (XRD analysis). The XRD analysis was carried out using an X-ray diffractometer (product name: "RAD") by Rigaku Corp. Also, θ was scanned from 10° to 20° with 2θ fixed at 30.8°, for measurement of the (300) planes. The X-ray irradiation range of the X-ray diffractometer was 5-10 mm×5-10 mm. The measurement results are shown in FIG. 1. Two X-ray reflection peaks, at 13.625° and 14.180°, were confirmed. Thus, the produced single crystals were confirmed to be single crystals which each have two partial region surfaces on the (100) plane with θ of 0.555°, thus satisfying the condition of inequality (1).

Comparative Example 1

First, a molten liquid comprising $Ce_{0.01}Gd_{1.99}SiO_5$ was obtained by the same procedure and under the same conditions as in Example 1. Next, the tip of a lifting rod having a seed crystal fixed to its lower end was introduced into the molten liquid for seeding. A single crystal ingot with an 8 mm neck diameter was lifted out at a lifting speed of 1-3 mm/h to form a neck section. A cone section (cylindrical section) was then lifted out, with lifting of the cylindrical section starting when the diameter (D) reached 105 mm. After growing the cylindrical section, the single crystal ingot was cut away from the molten liquid and cooling was initiated.

The cooling time A was 50 hours and the cooling time B was 50 hours. Upon completion of the cooling, the obtained single crystal was removed out. The obtained single crystal had a crystal mass of 18.9 kg, a cone section length of 70 mm, a cylinder length of 280 mm and a cylindrical section diameter (D) of 108 mm.

An inner perimeter knife cutter was then used for sectional cutting of the obtained single crystal at spacings of 20 mm. The blade used in the inner perimeter knife cutter was electrodeposited with #325-400 natural diamond. After the sectional cutting, a multi band saw was used for cutting of the resultant single crystals at a 6 mm pitch in the direction normal to the sectional cutting, followed by cutting at a 4 mm pitch in the direction normal to the obtained cut surfaces, thereby cutting out 4×6×20 mm products (single crystals). The cutting abrasive used in the multi band saw was a #500 SiC slurry. When the 4×6×20 mm cut products were examined, 37% of the products exhibited cleavage fracture, and therefore the yield was 63%.

Next, reflection on the (100) planes of the cut products was measured using X-rays (XRD analysis). The XRD analysis was carried out using an X-ray diffractometer (product name: "RAD") by Rigaku Corp. Also, θ was scanned from 10° to 20° with 2θ fixed at 30.8°, for measurement of the (300) planes. The X-ray irradiation range of the X-ray diffractometer was 5-10 mm×5-10 mm. The measurement results are shown in FIG. 5. A single X-ray reflection peak at 12.470° was confirmed. Thus, the produced single crystals were confirmed to be single crystals which do not have two partial region surfaces on the (100) plane satisfying the condition of inequality (1).

According to the invention, it is possible to provide rare earth silicate single crystals wherein generation of cleavage fracture can be adequately prevented even with large sized crystals, and a process for their production.

Rare earth silicate single crystals of the invention can be utilized for an optical material such as a scintillator material.

What is claimed is:
1. A rare earth silicate single crystal which, when produced as a single crystal ingot, can be formed by being cut out from said single crystal ingot, and which has a crystal face whose Miller indices can be determined by X-ray diffraction,
wherein
said crystal face is composed of a plurality of smooth partial region surfaces,
said plurality of partial region surfaces each have an area detectable by X-ray diffraction, and
the angles θ formed between the normal vectors of said plurality of partial region surfaces satisfy the following inequality (1):

$$0.1° \leq \theta \leq 2.0° \qquad (1).$$

2. The rare earth silicate single crystal according to claim 1, wherein said rare earth silicate single crystal is a monoclinic crystal belonging to space group $P2_1/c$.

3. The rare earth silicate single crystal according to claim 1, wherein said crystal face is the (100) plane and cleavage can be formed along said (100) plane.

4. The rare earth silicate single crystal according to claim 1, wherein said rare earth silicate single crystal has the chemical composition represented by general formula (2) below and simultaneously satisfies the conditions represented by inequalities (3) to (5) below:

$$Ln_{2x}Si_yO_{(3x+2y)}:A \qquad (2)$$

$$0.9 \leq x \leq 1.1 \qquad (3)$$

$$0.9 \leq y \leq 2.1 \qquad (4)$$

$$4.5 \leq (3x+2y) \leq 7.5 \qquad (5)$$

where $Ln_{2x}Si_yO_{(3x+2y)}$ represents the chemical composition of the host material, Ln represents at least one element selected from the group consisting of rare earth elements, A is an element of dopant doped in said host material and represents at least one element selected from the group consisting of Ce, Eu, Tb and Yb, and x and y each represent a value simultaneously satisfying the conditions represented by inequalities (3) to (5).

5. The rare earth silicate single crystal according to claim 4, wherein said rare earth silicate single crystal has the chemical composition represented by the following formula (I):

$$Gd_2SiO_5:Ce \qquad (I).$$

6. The rare earth silicate single crystal according to claim 1, wherein said rare earth silicate single crystal has the chemical composition represented by general formula (6) below and simultaneously satisfies the conditions represented by inequalities (7) to (9) below:

$$Ln_{2x}Si_yO_{(3x+2y)} \qquad (6)$$

$$0.9 \leq x \leq 1.1 \qquad (7)$$

$$0.9 \leq y \leq 2.1 \qquad (8)$$

$$4.5 \leq (3x+2y) \leq 7.5 \qquad (9)$$

where $Ln_{2x}Si_yO_{(3x+2y)}$ represents the chemical composition of the host material, Ln represents at least one element selected from the group consisting of rare earth elements, and x and y each represent a value simultaneously satisfying the conditions represented by inequalities (7) to (9).

7. The rare earth silicate single crystal according to claim 6, wherein said rare earth silicate single crystal has the chemical composition represented by the following formula (II):

$$Gd_2SiO_5 \qquad (II).$$

8. A process for production of a rare earth silicate single crystal,
wherein said process comprises at least
a melting step wherein the starting material is melted down to obtain a molten liquid by a melt process, a cooling/solidification step wherein said molten liquid is cooled to solidification to obtain a single crystal ingot, and a cutting step wherein said single crystal ingot obtained by said cooling/solidification step is cut to a prescribed shape and size, wherein the chemical composition conditions of the molten liquid, the melting conditions in said melting step, and the cooling conditions in said cooling/solidification step are at least controlled in such a manner that the cut surfaces of said single crystal ingot which has been cut in said cutting step are crystal faces whose Miller indices can be determined by X-ray diffraction, said crystal faces are each composed of a plurality of smooth partial region surfaces, and the angles θ formed between the normal vectors of said plurality of partial region surfaces satisfy the following inequality (1):

$$0.1° \leq \theta \leq 2.0°$$ (1).

9. The process for production of a rare earth silicate single crystal according to claim 8,
wherein
said melt process is the Czochralski process,
the procedure of said melting step and said cooling/solidification step is carried out using a lifting apparatus with a high-frequency induction heating furnace in which said molten liquid is obtained by heat treatment using a high-frequency induction coil,
a heater is further situated on the upper inner wall of said high-frequency induction heating furnace which is not in contact with said molten liquid, to allow heating of the cylindrical single crystal ingot lifted out from said molten liquid, and
the heat output from said heater is controlled independently of said high-frequency induction coil.

10. The process for production of a rare earth silicate single crystal according to claim 9,
wherein said cooling/solidification step based on said Czochralski process comprises
a growth step wherein the heat output from said heater is controlled to grow the cylindrical single crystal ingot lifted out from said molten liquid until its cross-section has a diameter of D [mm], and
a cooling step wherein the heat output from said heater is controlled to cool the grown single crystal ingot obtained by said growth step,
the heat output from said heater being controlled so that the cooling conditions for said cooling/solidification step simultaneously satisfy the conditions represented by the following inequalities (10) and (11):

$$0.25D \leq A \leq 0.35D$$ (10)

$$B \geq 0.4D$$ (11)

where A represents the cooling time required to reduce the heat output from 100% to 50% and B represents the cooling time required to reduce the heat output from 50% to 0% in said cooling step, where 100% is the heat output from said heater at the end of said growth step.

11. The process for production of a rare earth silicate single crystal according to claim 9, wherein during the procedure of said melting step and said cooling/solidification step, said high-frequency induction heating furnace is filled with a mixed gas composed mainly of an inert gas satisfying the condition represented by the following inequality (12):

$$0\% < 100 \times \{G/(E+G)\} \leq 2.0\%$$ (12)

where E represents the partial pressure of the inert gas in said mixed gas, and G represents the partial pressure of oxygen gas in said mixed gas.

12. The process for production of a rare earth silicate single crystal according to claim 8, wherein the obtained single crystal is a monoclinic crystal belonging to space group P2$_1$/c.

13. The process for production of a rare earth silicate single crystal according to claim 8, wherein said crystal face is the (100) plane and cleavage can be formed along said (100) plane.

14. The process for production of a rare earth silicate single crystal according to claim 8, wherein the obtained single crystal has the chemical composition represented by general formula (2) below and simultaneously satisfies the conditions represented by inequalities (3) to (5) below:

$$Ln_{2x}Si_yO_{(3x+2y)}:A$$ (2)

$$0.9 \leq x \leq 1.1$$ (3)

$$0.9 \leq y \leq 2.1$$ (4)

$$4.5 \leq (3x+2y) \leq 7.5$$ (5)

where $Ln_{2x}Si_yO_{(3x+2y)}$ represents the chemical composition of the host material, Ln represents at least one element selected from the group consisting of rare earth elements, A is an element of dopant doped in said host material and represents at least one element selected from the group consisting of Ce, Eu, Tb and Yb, and x and y each represent a value simultaneously satisfying the conditions represented by inequalities (3) to (5).

15. The process for production of a rare earth silicate single crystal according to claim 14, wherein the obtained single crystal has the chemical composition represented by the following formula (I):

$$Gd_2SiO_5:Ce$$ (I).

16. The process for production of a rare earth silicate single crystal according to claim 8, wherein the obtained single crystal has the chemical composition represented by general formula (6) below and simultaneously satisfies the conditions represented by inequalities (7) to (9) below:

$$Ln_{2x}Si_yO_{(3x+2y)}$$ (6)

$$0.9 \leq x \leq 1.1$$ (7)

$$0.9 \leq y \leq 2.1$$ (8)

$$4.5 \leq (3x+2y) \leq 7.5$$ (9)

where $Ln_{2x}Si_yO_{(3x+2y)}$ represents the chemical composition of the host material, Ln represents at least one element selected from the group consisting of rare earth elements, and x and y each represent a value simultaneously satisfying the conditions represented by inequalities (7) to (9).

17. The process for production of a rare earth silicate single crystal according to claim 16, wherein the obtained single crystal has the chemical composition represented by the following formula (II):

$$Gd_2SiO_5$$ (II).

18. A process for production of a rare earth silicate single crystal,
wherein said process comprises at least
a melting step wherein the starting material is melted down to obtain a molten liquid by a melt process,
a cooling/solidification step wherein said molten liquid is cooled to solidification to obtain a single crystal ingot, a cutting step wherein said single crystal ingot obtained by said cooling/solidification step is cut to a prescribed shape and size, and a selection step wherein single crystals cut from the single crystal ingot obtained by the cutting step, in which the cut surfaces are crystal faces whose Miller indices can be determined by X-ray diffraction, said crystal faces are each composed of a plurality of smooth partial region surfaces, and the angles θ formed between the normal vectors of said plurality of partial region surfaces satisfy the following inequality (1), are selected, while those not satisfying the conditions are excluded:

$$0.1° \leq \theta \leq 2.0° \tag{1}$$

19. The process for production of a rare earth silicate single crystal according to claim 18, wherein said melt process is the Czochralski process, the procedure of said melting step and said cooling/solidification step is carried out using a lifting apparatus with a high-frequency induction heating furnace in which said molten liquid is obtained by heat treatment using a high-frequency induction coil, a heater is further situated on the upper inner wall of said high-frequency induction heating furnace which is not in contact with said molten liquid, to allow heating of the cylindrical single crystal ingot lifted out from said molten liquid, and the heat output from said heater is controlled independently of said high-frequency induction coil.

20. The process for production of a rare earth silicate single crystal according to claim 19, wherein said cooling/solidification step based on said Czochralski process comprises a growth step wherein the heat output from said heater is controlled to grow the cylindrical single crystal ingot lifted out from said molten liquid until its cross-section has a diameter of D [mm], and a cooling step wherein the heat output from said heater is controlled to cool the grown single crystal ingot obtained by said growth step, the heat output from said heater being controlled so that the cooling conditions for said cooling/solidification step simultaneously satisfy the conditions represented by the following inequalities (10) and (11):

$$0.25D \leq A \leq 0.35D \tag{10}$$

$$B \geq 0.4D \tag{11}$$

where A represents the cooling time required to reduce the heat output from 100% to 50% and B represents the cooling time required to reduce the heat output from 50% to 0% in said cooling step, where 100% is the heat output from said heater at the end of said growth step.

21. The process for production of a rare earth silicate single crystal according to claim 19, wherein during the procedure of said melting step and said cooling/solidification step, said high-frequency induction heating furnace is filled with a mixed gas composed mainly of an inert gas satisfying the condition represented by the following inequality (12):

$$0\% < 100 \times \{G/(E+G)\} \leq 2.0\% \tag{12}$$

where E represents the partial pressure of the inert gas in said mixed gas, and G represents the partial pressure of oxygen gas in said mixed gas.

22. The process for production of a rare earth silicate single crystal according to claim 18, wherein the obtained single crystal is a monoclinic crystal belonging to space group $P2_1/c$.

23. The process for production of a rare earth silicate single crystal according to claim 18, wherein said crystal face is the (100) plane and cleavage can be formed along said (100) plane.

24. The process for production of a rare earth silicate single crystal according to claim 18, wherein the obtained single crystal has the chemical composition represented by general formula (2) below and simultaneously satisfies the conditions represented by inequalities (3) to (5) below:

$$Ln_{2x}Si_yO_{(3x+2y)}:A \tag{2}$$

$$0.9 \leq x \leq 1.1 \tag{3}$$

$$0.9 \leq y \leq 2.1 \tag{4}$$

$$4.5 \leq (3x+2y) \leq 7.5 \tag{5}$$

where $Ln_{2x}Si_yO_{(3x+2y)}$ represents the chemical composition of the host material, Ln represents at least one element selected from the group consisting of rare earth elements, A is an element of dopant doped in said host material and represents at least one element selected from the group consisting of Ce, Eu, Tb and Yb, and x and y each represent a value simultaneously satisfying the conditions represented by inequalities (3) to (5).

25. The process for production of a rare earth silicate single crystal according to claim 24, wherein the obtained single crystal has the chemical composition represented by the following formula (I):

$$Gd_2SiO_5:Ce \tag{I}$$

26. The process for production of a rare earth silicate single crystal according to claim 18, wherein the obtained single crystal has the chemical composition represented by general formula (6) below and simultaneously satisfies the conditions represented by inequalities (7) to (9) below:

$$Ln_{2x}Si_yO_{(3x+2y)} \tag{6}$$

$$0.9 \leq x \leq 1.1 \tag{7}$$

$$0.9 \leq y \leq 2.1 \tag{8}$$

$$4.5 \leq (3x+2y) \leq 7.5 \tag{9}$$

where $Ln_{2x}Si_yO_{(3x+2y)}$ represents the chemical composition of the host material, Ln represents at least one element selected from the group consisting of rare earth elements, and x and y each represent a value simultaneously satisfying the conditions represented by inequalities (7) to (9).

27. The process for production of a rare earth silicate single crystal according to claim 26, wherein the obtained single crystal has the chemical composition represented by the following formula (II):

$$Gd_2SiO_5 \tag{II}$$

* * * * *